United States Patent
Usami et al.

(10) Patent No.: US 6,493,856 B2
(45) Date of Patent: Dec. 10, 2002

(54) AUTOMATIC CIRCUIT GENERATION APPARATUS AND METHOD, AND COMPUTER PROGRAM PRODUCT FOR EXECUTING THE METHOD

(75) Inventors: Kimiyoshi Usami, Kanagawa-ken (JP); Naoyuki Kawabe, Kanagawa-ken (JP); Masahiro Kanazawa, Kanagawa-ken (JP); Masayuki Koizumi, Kanagawa-ken (JP); Hidemasa Zama, Kanagawa-ken (JP); Toshiyuki Furusawa, Tokyo (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/895,376

(22) Filed: Jun. 29, 2001

(65) Prior Publication Data

US 2002/0002701 A1 Jan. 3, 2002

(30) Foreign Application Priority Data

Jun. 29, 2000 (JP) ........................................ 2000-197270

(51) Int. Cl.[7] .............................................. G06F 17/50
(52) U.S. Cl. ................................ 716/10; 716/2; 716/12
(58) Field of Search ................................ 716/10, 11, 12, 716/17, 5, 6; 706/919, 920, 921, 922

(56) References Cited

U.S. PATENT DOCUMENTS

| | | | | |
|---|---|---|---|---|
| 5,477,475 A | * | 12/1995 | Sample et al. | 364/578 |
| 5,774,367 A | | 6/1998 | Reyes et al. | 364/628 |
| 5,903,577 A | * | 5/1999 | Teene | 371/22.1 |

FOREIGN PATENT DOCUMENTS

JP     11-195973     7/1999

OTHER PUBLICATIONS

Mutoh, S., et al. (1995) "*1–V Power Supply High–Speed Digital Circuit Technology with Multithreshold–Voltage CMOS*" IEEE J. Solid–State Circuits 30(8):847–854.

Kuroda, T., et al. (1996) "*A 0.9–V, 150–MHz, 10–mW, 4 mm$^2$, 2–D Discrete Cosine Transform Core Processor with Variable Threshold–Voltage (VT) Scheme*" IEEE J. Solid–State Circuits 31(11):1770–1779.

Mutoh et al., IEEE Journal of Solid–State Circuits, "I–V Power Supply High –Speed Digital Circuit Technology with Mulltithreshold–Voltage CMOS", Aug. 30, 1995, No. 8, pp. 847–853.

Kuroda, IEEE 1999, System ULSI Engineering Lab., Toshiba Corporation, "Low Power CMOS Digital Design for Multimedia Processors", pp. 359–367.

* cited by examiner

Primary Examiner—Tuan T. Lam
Assistant Examiner—An T. Luu
(74) Attorney, Agent, or Firm—Gray Cary Ware & Freidenrich LLP (57) ABSTRACT

An automatic circuit generation methods and apparatus (1) provide a desired circuit performance by reducing a leakage current during both a standby state and an active state, where cells having only High-Vth and Mt cells having both High-Vth transistors and Low-Vth translators are optimally mixed in a logical circuit. It is thereby possible to suppress efficiently the leakage current, in a design stage, generated according to miniaturization of LSI layout design and also lowering a supply voltage to the LSI.

15 Claims, 9 Drawing Sheets

(ONLY High-Vth CELL)

TIMING VIOLATION PATH

AUTOMATIC CIRCUIT GENERATION APPARATUS ~1

FIG.4B

AUTOMATIC CIRCUIT GENERATION APPARATUS ~1

(BOTH High-Vth CELL AND MT CELL)

AUTOMATIC CIRCUIT GENERATION APPARATUS AND METHOD, AND COMPUTER PROGRAM PRODUCT FOR EXECUTING THE METHOD

CROSS-REFERENCE TO RELATED APPLICATION

This application claims benefit of priority under 35 USC § 119 to Japanese Patent Application No. 2000-197270, filed on Jun. 29, 2000, the entire contents of which are incorporated by reference herein.

BACKGROUND OF THE INVENTION

1. Field of the Invention

The present invention relates to an automatic circuit generation apparatus and method which automatically generate a circuit capable of eliminating a leakage current in a target circuit in a CMOS logical LSI, and relates to a computer program product for executing the automatic circuit generation method.

2. Description of the Related Art

Recently, according to miniaturizatlon of LSI layout design and lowering a supply voltage to the LSI, the threshold voltage Vth of a MOS transistor in the LSX is more decreased as low as possible. Because the lowering the threshold voltage Vth causes to increase the amount of a sub-threshold leakage current, the increasing of the sub-threshold leakage current in the MOS transistor also causes a serious problem to decrease the battery-life in battery drivers such as portable phones (or digital cellular phone), personal digital assistants, notebooks. palm-top computers, mobile communication terminals, and the like. The standby leakage current always flows through the MOS transistor on a standby mode (or a sleep period) and in an active mode in which the circuits comprising NOS transistors operate.

Figure 1:
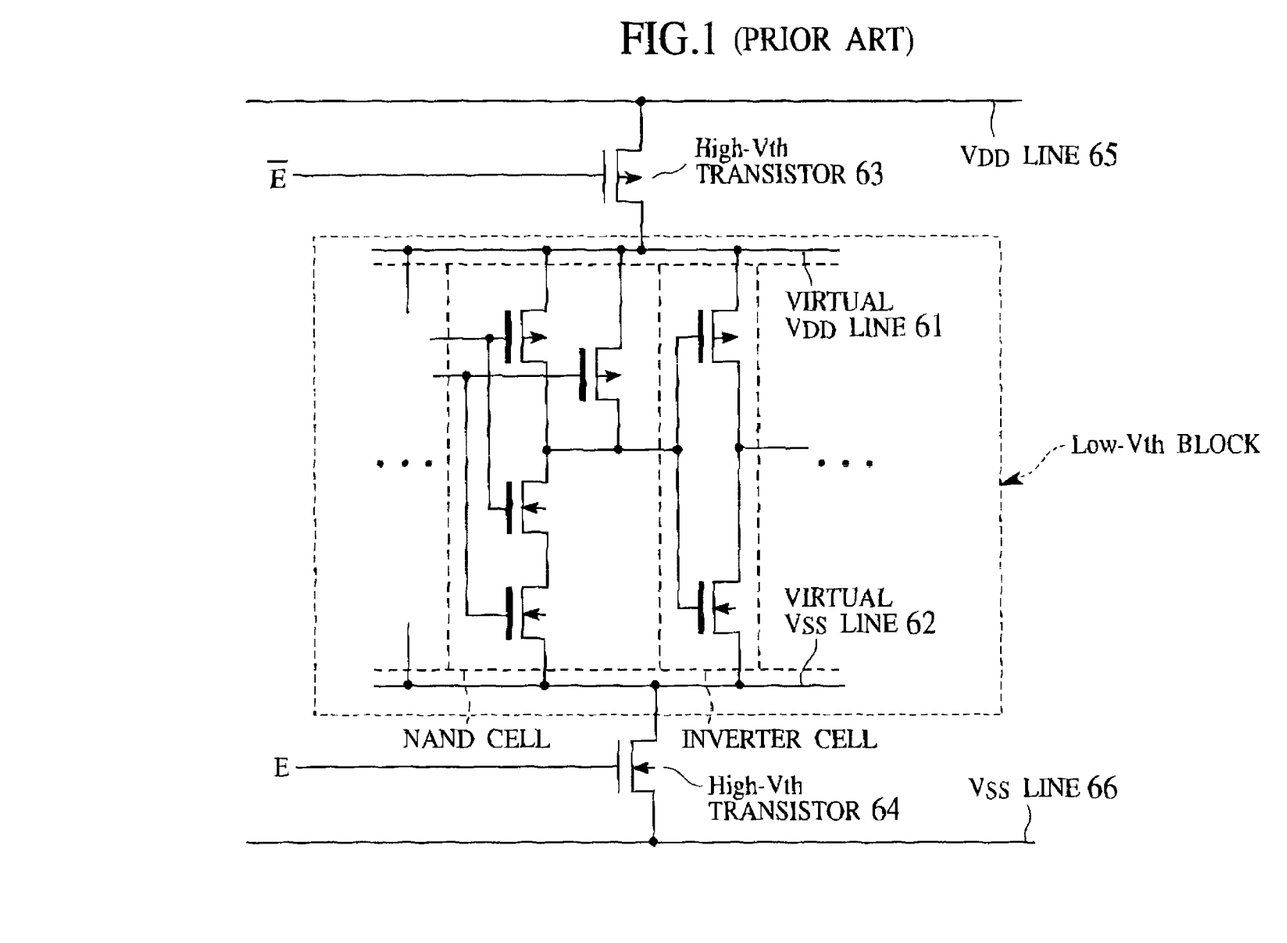
FIG. 1 is a circuit diagram to be used in explanation of a conventional MTCMOS technology.

MTCMOS (MultiThreahold-Voltage CMOS) technology shown in FIG. 1 has been proposed as a conventional method of reducing the leakage current. In this MTCMOS technology, the entire logical circuits (including a plurality of cells such as NAND cells and inverter cells In this example) is made up of MOS transistors of a low threshold voltage (L-Vth). In addition, logical circuits are connected to the virtual VDD line 61 and virtual VSS line 62, and the virtual VDD line 61 and the virtual VSS line 62 are connected to a VDD line 65 and a VSS line 66 through KOS transistors 63 and 64 of a high threshold voltage (H-Vth), respectively. The voltages VDD mad VSS are supplied from external devices (not shown) to the VDD line 65 and the VSS line 66. In order to reduce the amount of the leakage current, the MTCMOS method controls that both the MOS transistors 63 and 64 of the H-Vth are ON (the active mode) during the operation and both the MOS transistors 63 and 64 are OFF on the standby mode (the sleep period).

However, in the above-described conventional method based on the MTCMOS technology, the amount of the current to be supplied from the VDD line 65 to the virtual VDD line 61 and the amount of the current flows from the virtual VSS line 63 to the VSS line 66 during operation are determined according to the ON resistances of both the MOS transistors 63 and 64 of a high threshold voltage H-Vth. In order to achieve the high-speed operation of the LSI, it in necessary to reduce the ON resistance of each MOS transistor. That is, It is necessary to increase a width (W) of each of the KOS transistors 63 and 66 of the high threshold voltage H-Vth. This causes to increase the area of the LSI. Further, it must be necessary to determine the width of each MOS transistor of the high threshold voltage H-Vth based on following various conditions, for example:

First, the amount of the leakage current is greatly changed according to an input pattern supplied to a logical circuit: and Second, in a case that a part of MOS transistors connected to the virtual VDD line 61 consumes a large amount of power, the level of a voltage on the virtual VDD line 61 is temporarily down. This decreased voltage affects the operation of other MOS transistors connected to the virtual VDD line 61. For example, the operation speed of the MOS transistor is decreased. These problems described above lead to a complicated circuit design under MTCMOS technology.

Figure 2:
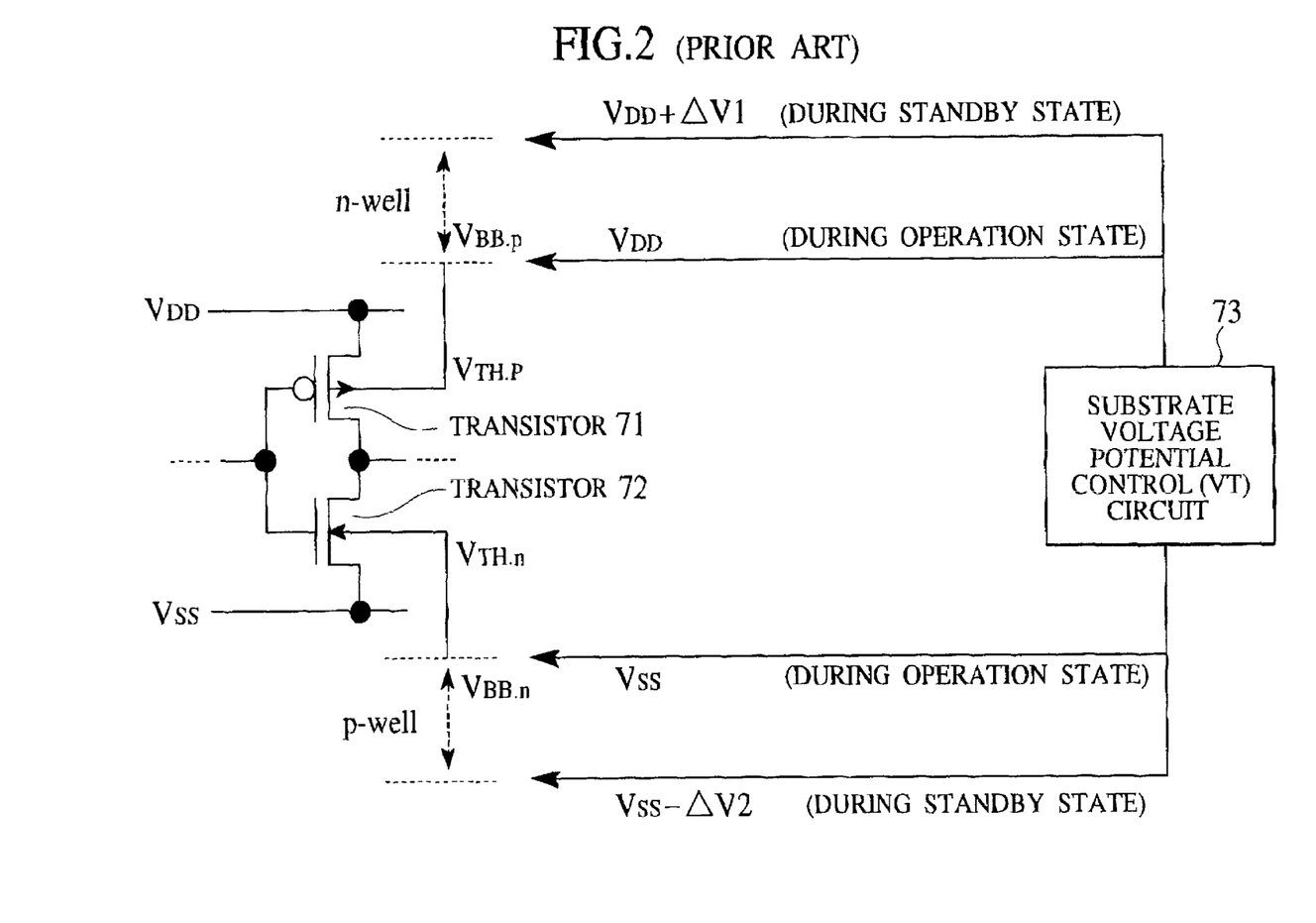
FIG. 2 is a circuit diagram to be used in explanation of the conventional MTCMOS technology.

Furthermore, there is VTCMOS (Variable Threshold-Voltage CMOS) technology shown in FIG. 2 as a conventional leakage current decreasing technology. In VTCMOS, the entire logical circuit comprises low-threshold voltage MOS transistors 71 and 72. A substrate voltage control (VT) circuit 73 supplies a substrate voltage ($+\Delta V1$ and $-\Delta V2$) to both the MOS transistors 71 and 72 an the standby mode in order to enhance an effective threshold voltage Vth and to decrease the amount of the leakage current.

However, the use of this conventional VTCMOS technology requires to form a device with a triple-well structure in order to achieve the reliability of the device, and to form the device with the layout structure in which the substrate voltage is supplied to each MOS transistor independently. This demand also leads to a complicated circuit design under VTCMOS technology.

There is another conventional method of reducing the amount of the standby leakage current in which a power is shut down forcedly on the standby mode. However, in this conventional method, data items stored in memory circuits and flip-flops (F/F) mounted on a LSI are erased or broken. In order to avoid this drawback, although it must be necessary to create backup copies of required data items before the shutdown of the power, the system design becomes complicated. Furthermore, it is necessary to keep the time to restore the backup copies to the corresponding memory circuits and F/Fs when the standby mode is shifted to the operation mode in addition to the time to create the backup copies of the data items. This causes to increase the operation time period and to reduce the operation speed (performance).

The three conventional methods described above still have another serious problem, that is, the active leakage current during the active mode. According to progress of the miniaturization of LSI layout design, the power consumption of the active leakage current in the active mode becomes large, namely not negligibly when compared with that of the switching operation. Those conventional three methods cannot suppress the active leakage current that flows in the active mode.

SUMMARY OF THE INVENTION

Accordingly, an object of the present invention is, with due consideration to the drawbacks of the conventional techniques, to provide an automatic circuit generation method and apparatus, and a computer program product for executing the automatic circuit generation method by a computer system. The automatic circuit generation apparatus and method of the present invention can automatically generate a circuit that reduces a standby leakage current during both the standby mode and active mode as low as possible with keeping a circuit performance such as operation speed and circuit area, in order to increase the efficiency of the circuit design.

According to an aspect of the present invention, an automatic circuit generation method and apparatus basically have a function defined by following steps (A) to (C): (A) Inputting circuit information, to be used for performing an automatic logical circuit generation, including a net list having high-threshold cells made up of only high-threshold voltage transistors, and interpreting the circuit information inputted; (B) Identifying a path whose delay time is larger than a timing constraint that has been set in advance by performing a static timing analysis for a logical circuit in the net list based on the result of the analysis for the circuit information inputted; and (C) Replacing high-threshold cells in at least a part of the path, whose delay time is larger than the timing constraint, with MT cells, each MT cell made up of the high-threshold voltage transistors and low-threshold voltage transistors.

BRIEF DESCRIPTION OF THE DRAWINGS

These and other objects, features, aspects and advantages of the present invention will become more apparent from the following detailed description of the present invention when taken in conjunction with the accompanying drawings, in which.

DETAILED DESCRIPTION OF THE PREFERRED EMBODIMENTS

Other features of this invention will become apparent through the following description of preferred embodiments which are given for illustration of the invention and are not intended to be limiting thereof.

First Embodiment

Figure 3:
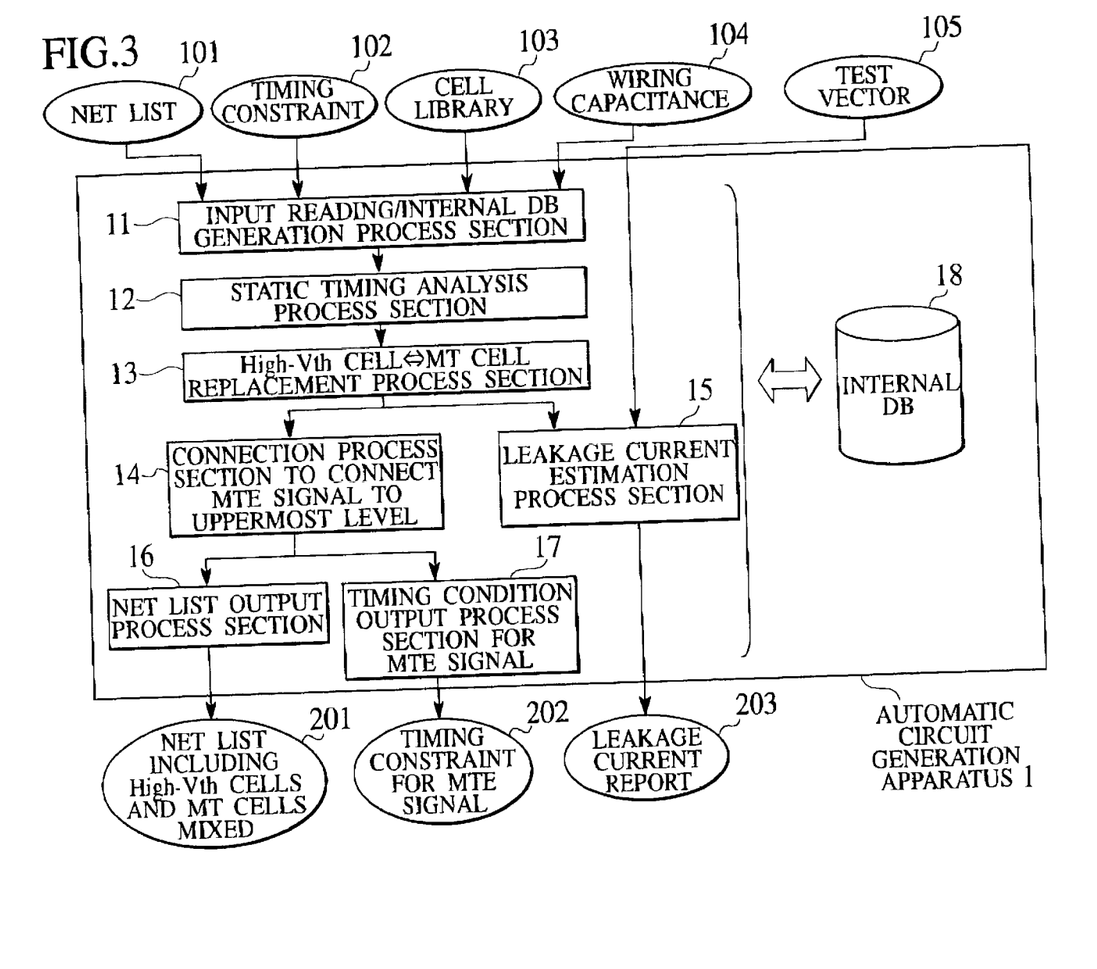
FIG. 3 is a block diagram showing a configuration of an automatic circuit generation apparatus according to the first embodiment of the present invention.

FIG. 3 is a block diagram showing a configuration of an automatic circuit generation apparatus according to the first embodiment of the present invention.

The automatic circuit generation apparatus 1 comprises an input-read/internal database (DB) generation process section 11, a static timing analysis process section 12, a H-Vth cell/MT cell replacement process section 13, a connection process section 14 to connect MTE signal to an uppermost level in hierarchical design, a leakage current estimation process section 15, a net list output process section 16, a timing constraint output process section 17 for a MT signal to control the amount of a leakage current in a MT cell, and an internal database (DB) 18.

The input-read/internal database (DB) generation process section 11 inputs various kinds of information such as a net list 101, timing constraint 102, a cell library 103, and a wiring capacitance 104. The leakage current estimation process section 15 inputs a test vector 105. The net list output process section 16 outputs a not list 201 in which cells of high threshold voltage transistors and MT calls are included. The timing constraint output process section 17 outputs the timing constraint 202 of the MTE signal. The leakage current estimation process section 15 outputs a leakage current report 203, FIGS. 4A and 4B are diagrams showing a basic operation to generate a circuit capable of reducing the amount of a leakage current by the automatic circuit generation apparatus 1 shown in FIG. 3.

Figure 4A:
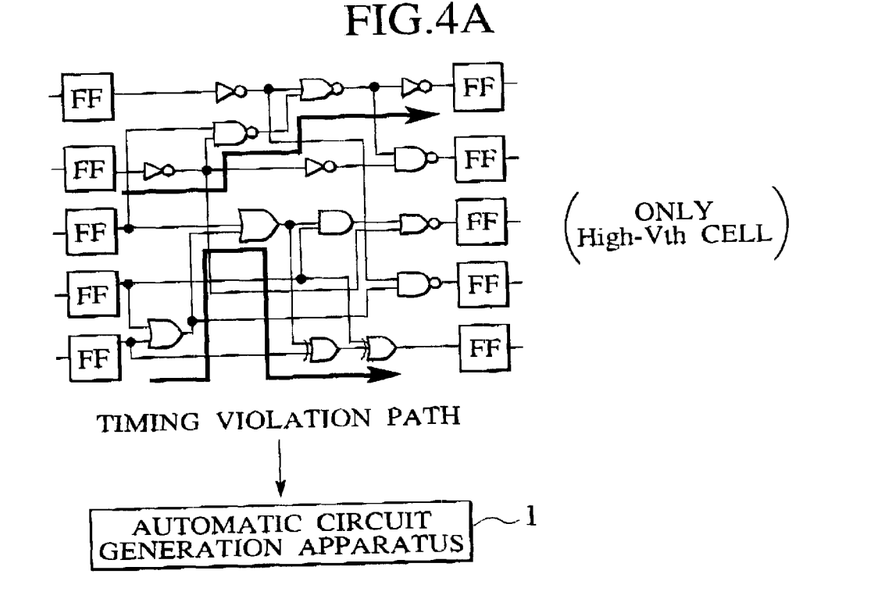
FIGS. 4A and 4B are diagrams showing a basic operation to generate a circuit capable of reducing a leakage current by the automatic circuit generation apparatus shown in FIG. 3.

FIG. 4A shows a logical circuit consisting of only high threshold voltage transistors (-Vth translators). This circuit shown in FIG. 4A is not capable of reducing the leakage current completely.

Figure 4B:
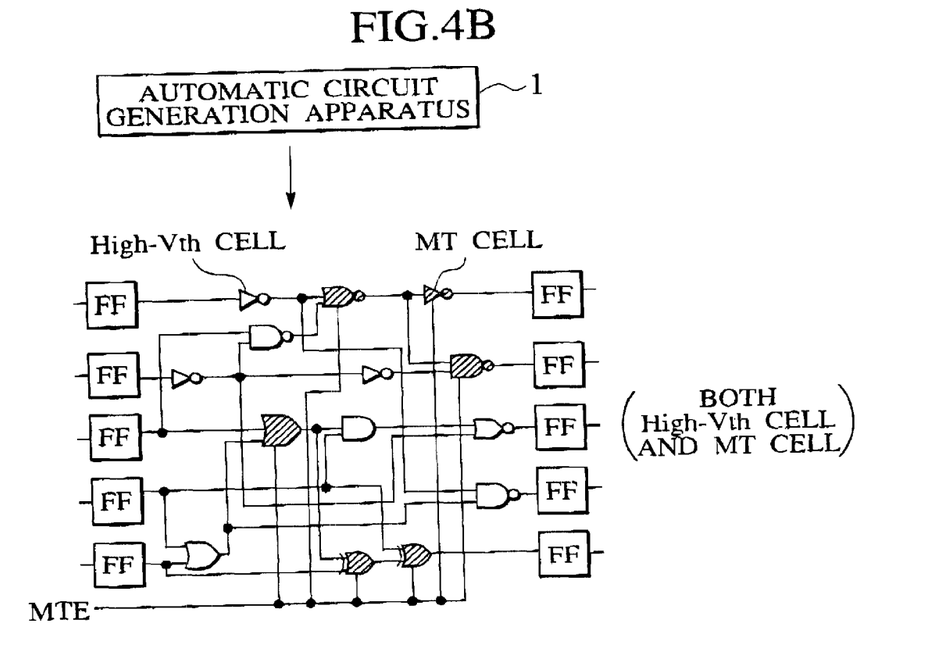

FIG. 4B shows a logical circuit capable of reducing the amount of a leakage current, which is generated automatically by the automatic circuit generation apparatus 1 shown in FIG. 3. The logical circuit shown in FIG. 4B comprises both H-Vth transistors and low threshold voltage (L-Vth) transistors (hereinafter referred to as a MT call).

The H-Vth cell consists of one or more H-Vth transistors. In the logical circuit shown in FIG. 4B, the H-Vth cells and the MT cells are mixed in optimum position in a connection net of the logical circuit in order to reduce the leakage current in both the standby state and the active state.

Figure 5:
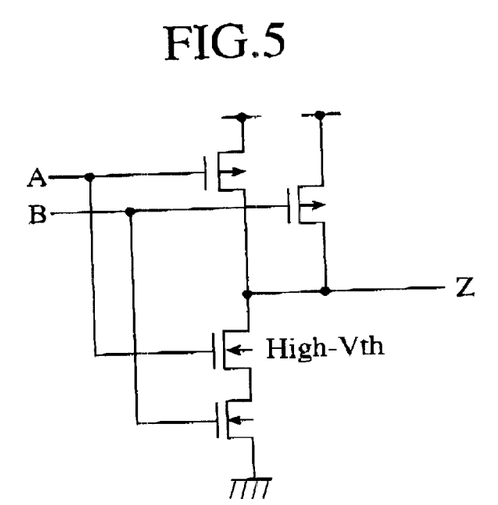
FIG. 5 is a circuit diagram showing a configuration of H-Vth cell in a NAND circuit that is made up of only H-Vth transistors.
Figure 6:
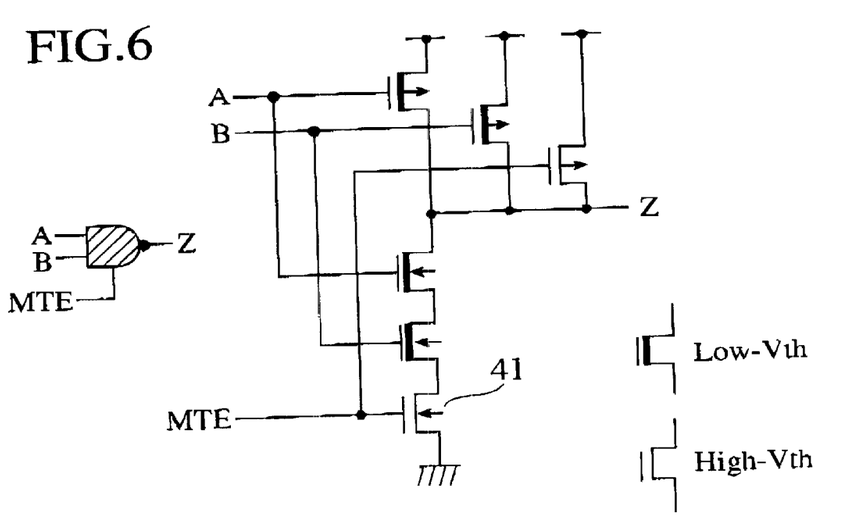
FIG. 6 is a circuit diagram showing a configuration of MT cell in a NAND circuit that is made up of L-Vth transistors and H-Vth transistors.

FIGS. 5 and 6 show the examples of H-Vth cell and MT cell, respectively. FIG. 5 shows a NAND circuit consisting of only H-Vth transistors and FIG. 6 shows the MT cell an a NAND circuit consisting of L-Vth transistors and H-Vth transistors.

When the control signal MTE of H level is supplied to the MT cell, the H-Vth transistor 41 enters ON in order to perform the high-speed operation only by the L-Vth transistors. On the other hand, when the control signal MTE of L level is supplied to the MT cell, the H-Vth transistor 41 enters OFF in order to enter the MT cell into the standby state in which no leakage current flows from VDD to GND.

When receiving the not list 101 that is made up of only H-Vth cells, the automatic circuit generation apparatus 1 shown in FIG. 5 replaces H-Vth cells included in a path of a timing violation with MT calls capable of operating with high speed during performing automatic timing analysis. In this cell-replacement process, because the amount of the leakage current in the MT cell in greater than that in the H-Vth cell in the active state, the timing violation must be eliminated efficiently while the increasing of the leakage current caused by the cell-replacement is suppressed as small an possible.

Figure 8:
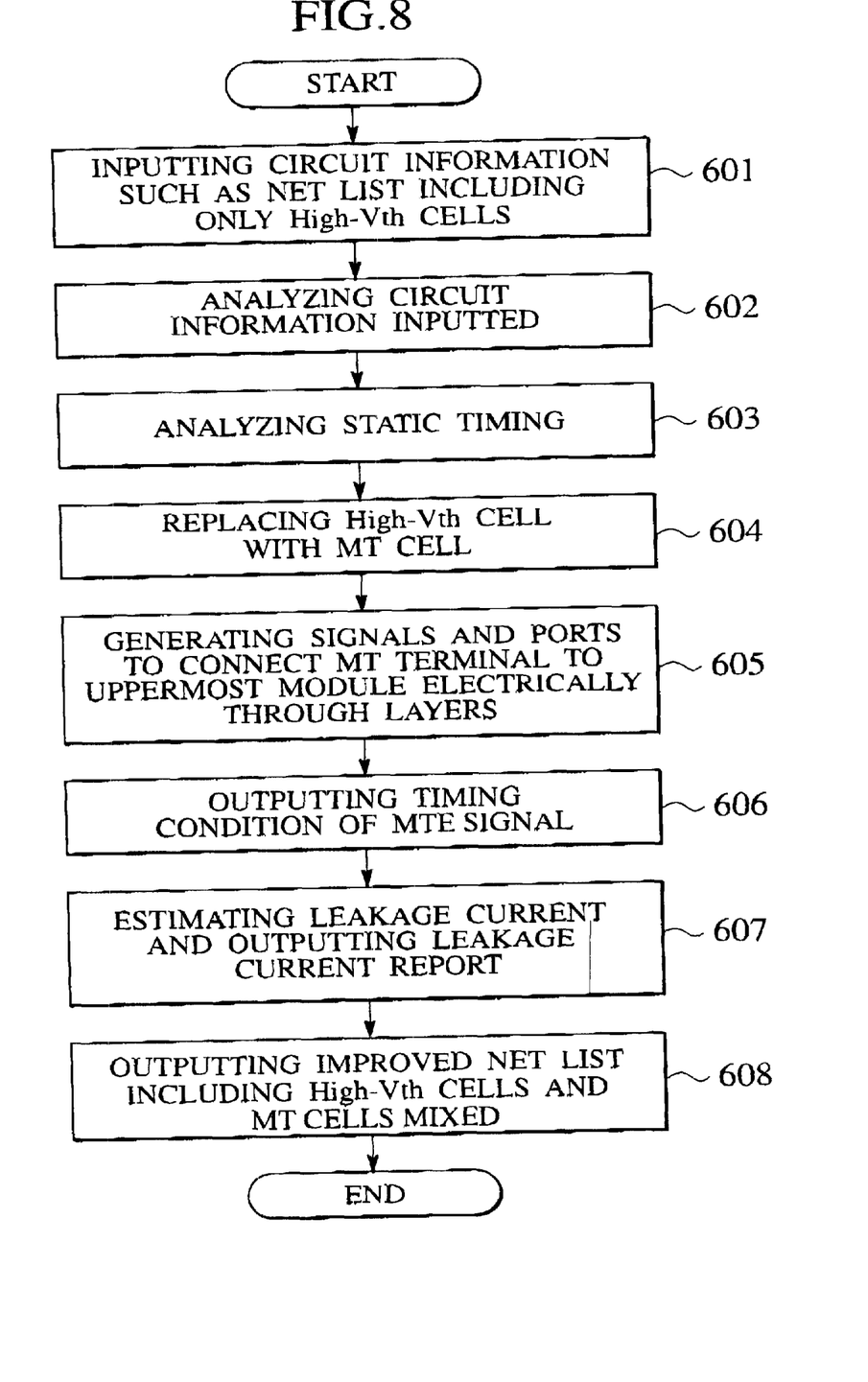
FIG. 8 is a flow chart showing an example of the operation of the automatic circuit generation method according to the first embodiment of the present invention.

Next, a description will be given of the operation of the first embodiment with reference to the flow chart shown in FIG. 8.

In Step S601, the input-read/internal DB generation process section 11 inputs a net list 101 of a gate level, the timing constraint 102 for this net list 101, the cell library 103, and the wiring capacitance 104. In Step S602, the information described above is analyzed to obtain the circuit connection information and attributes, and the internal database (DB) is generated based on the information and then stored into the database 18.

Next, in Step S603, the static timing analysis process section 12 calculates the delay time in the signal path and the timing margin with reference to the circuit connection information and the attributes.

In Step S604, the H-Vth cell/MT cell replacement process section 13 identifies the path having a large delay time that is in timing violation based on the result of the static timing analysis process in Step S603 performed by the static timing analysis process section 12, and performs the replacement process to replace H-Vth cell with a MT cell and stores the result of the replacement into the internal DB 18. This process is performed while the increasing of the amount of the leakage current is decreased an small as possible in order to eliminate the timing violations efficiently. It is also acceptable to use various replacement directions along which the replacement process is performed, for example, the replacement direction of left to right, and the replacement direction of right to left in FIG. 4A.

In addition to the above process, the connection process section 14 to connect the MTE signal to an upper level in hierarchical design performs the following process in Step S605. Because the H-Vth cell is replaced with the MT cell in the process of S604, a control terminal of the MTE cell is newly added, which was not in the original net list 101. The automatic circuit generation apparatus 1 of the present embodiment can automatically perform the generation of signals and ports that are transferred among hierarchical levels in order to propagate and connect the MTE terminal of each MTE cell to the upper level of module through the hierarchical net list.

Next, a description will be given of the operation of the timing constraint output process section 11 in Step S606.

Figure 7:
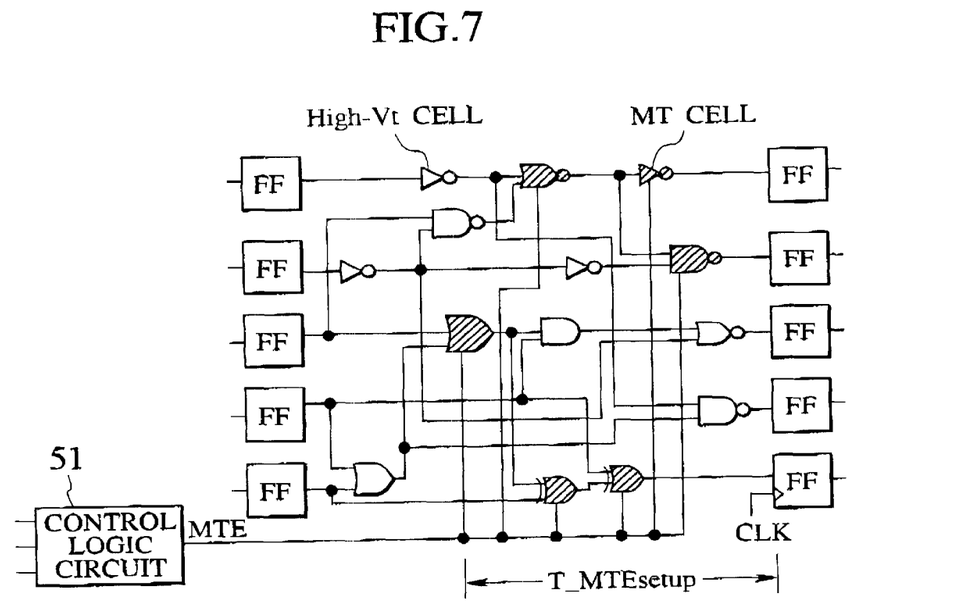
FIG. 7 is a circuit diagram showing an example of a logical circuit made up of H-Vth cells and MT cells.

As shown in FIG. 7, the MT cell can operate correctly only when the timing of the MTE signal is set before the edge of the clock CK by the time "T_MTEsetup" under a case that the MTE signal is generated by the control logical circuit 51. This is the necessary condition when the level of the MTE signal is switched from a low level to a High level. The automatic circuit generation apparatus as the tool of the present invention can calculate the necessary and sufficient timing regarding the T_MTEsetup automatically and outputs the calculation result as the timing constraint 202 of the MTE signal. The timing constraint 202 can be used in the synthesizing operation performed by the control logical circuit 51 generating the MTE signal.

In addition, the leakage current estimation process section 15 estimates the amount of the leakage current by analyzing the change of the level of the MTE signal against the test vector supplied form externally. That is, the leakage current in the MT cell is a large leakage current that is determined by the leakage current of the L-Vth transistor because the H-Vth transistor connected to GND becomes ON when the MTE signal is in a high level. On the other hand, because the H-Vth transistor connected to GND becomes OFF when MTE signal is in a low level, the amount of the leakage current becomes a small value that is determined by the H-Vth transistor.

On the contrary, the amount of the leakage current of the H-Vth cell becomes a value that is determined by the H-Vth transistor, not related to the value of the MTE signal.

Thus, in the circuit including both the H-Vth cell shown in FIG. 4D and the MT cell shown in FIG. 7 mixed, the total amount of the leakage current in the entire circuit is determined by the value of the MTE signal. In the first embodiment, the values of the leakage current in the MTE cell corresponding to each of H level and L level of the MTE signal are stored in the cell library 103. The automatic circuit generation apparatus 1 of the first embodiment reads the cell library 103 and then stores it into the internal DB 18. The same operation is also performed for the values of the leakage current in the H-Vth cell. In addition, the entire amount of the leakage current is estimated with reference to the internal DB 18 by analyzing the change of the state of the MTE signal by performing the logical simulation. The estimation result in outputted as a leakage current report 203.

Finally, in Step S608, the net list output process section 16 outputs the net list 201 in which both the H-Vth cells and the MT cells are mixed based on the information stored in the internal DB 18.

According to the first embodiment, by replacing the H-Vth cell on the path having a larger delay time (in timing violation) which is out of the timing constraint of the logical circuit comprising the H-Vth cells, it is possible to automatically generate the logical circuit in which both the H-Vth cells and the MT cells are mixed. Furthermore, because H-Vth cells in a part (H-Vth cell) of the logical circuit having the timing violation are replaced with the MT cells, the entire circuit can operate at high speed, and because the MT cells are used only in the part of the logical circuit, it is possible to reduce the amount of the leakage current during both the standby state and the active state, and also possible to reduce the occupied area of the logical circuit.

Second Embodiment

Next, a description will be given of the second embodiment of the present invention.

Figure 9:
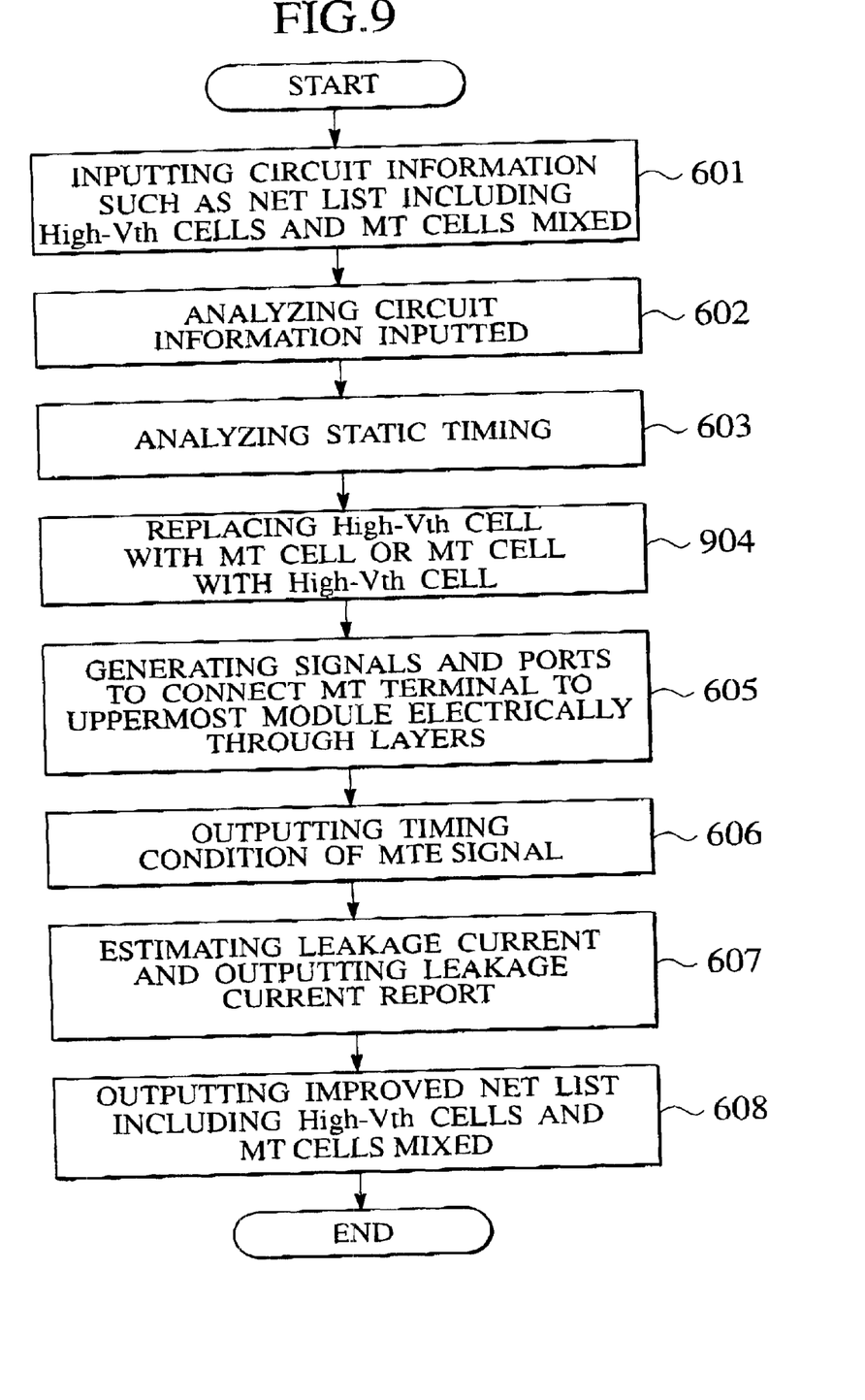
FIG. 9 is a flow chart showing an example of the operation of the automatic circuit generation method according to the second embodiment of the present invention.

FIG. 9 is a flow chart showing an example of the operation of the automatic circuit generation method according to the second embodiment of the present invention.

The second embodiment treats a net list in which both the H-Vth cells and the MT cells are originally mixed. That is, the automatic circuit generation apparatus and method of the second embodiment will perform again the timing adjustment for the layout result of the logical circuit which has been obtained by the automatic circuit generation apparatus and method of the first embodiment. That is, the apparatus and method of the first embodiment outputs the mixed net list including both the H-Vth cells and MT cells and then makes the layout result of the logical circuit based on the mixed net list, and the apparatus and method of the second embodiment performs the timing adjustment of the layout result again.

The process of Step S601 to S603 in the second embodiment are the same an those in the first embodiment. After those processes, in Step S901, both the following processes are performed.

H-Vth cell is replaced with MT cell; and

MT cell is replaced with H-Vth cell.

That is, H-Vth cells in the path having the timing violation detected by the static timing analysis process in Step S603 are replaced with MT cells.

On the other hand, Mt cells in the path having no timing violation are replaced with H-Vth cells within the timing margin.

In the second embodiment, the logical circuit including the H-Vth cells and the MT cells mixed is further refined in order to increase the performance of the logical circuit. It is also acceptable to use various replacement directions along which the replacement process is performed, for example, the replacement direction of left to right, and the replacement direction of right to left in FIG. 4A.

Third Embodiment

Next, a description will be given of the third embodiment of the present invention.

Figure 10:
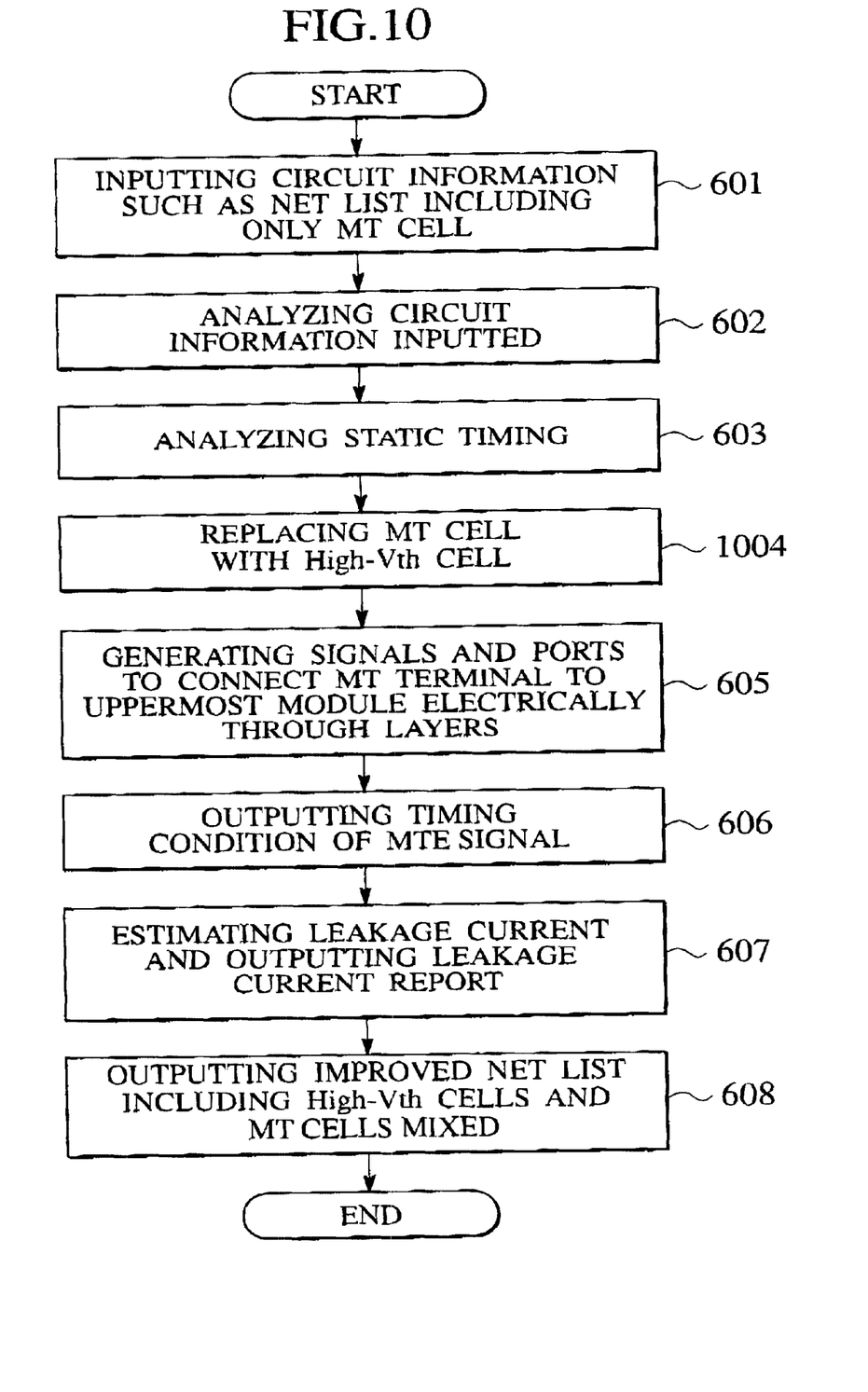
FIG. 10 is a flow chart showing an example of the operation of the automatic circuit generation method according to the third embodiment of the present invention.

FIG. 10 is a flow chart showing an example of the operation of the automatic circuit generation method according to the third embodiment of the present invention.

The third embodiment treats a net list including only MT cells. The process of Step S601 to S603 in the third embodiment are the same as those in the first embodiment. After those process, in Step S1002, one or more MT cells are replaced with H-Vth cells. That is, the Mt cell in the path having no timing violation is replaced with the H-Vth cell within the timing margin. It Is acceptable to use various replacement directions along which the replacement process it performed, for example, the replacement direction of left to right, and the replacement direction of right to left in FIG. 4A.

Thereby, it is possible to achieve a desired performance of the logical circuit and to reduce the amount of the leakage current that is rather than the amount of the leakage current that flows in the logical circuit based on the original net list.

The automatic circuit generation method of each of the first to third embodiments described above can be implemented as a computer program product. The user can execute each method by reading the computer program product and then performing it by the computer system. In this case, the computer program product can be supplied to the computer system through various mediums such as a disk-type recording medium (for example, a floppy diskette, a hard disk), a memory medium (for example, a semiconductor memory device, a card-type memory), or through a communication network.

As set forth in detail, according to the present invention, because it is possible to automatically generate a logical circuit capable of reducing the amount of a leakage current flowing during the standby and active states of the logical circuit as low as possible while keeping a desired circuit performance, a design efficiency can be increased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An automatic circuit generation method comprising:
inputting circuit information, to be used for performing an automatic logical circuit generation, including a net list having high-threshold calls made up of only high-threshold voltage transistors, and interpreting the circuit information inputted;
identifying a path whose delay time is larger than a timing constraint that has been set in advance by performing a static timing analysis for a logical circuit in the net list based on the result of the analysis for the circuit information inputted; and
replacing high-threshold cells in at least a part of the path, whose delay time is larger than the timing constraint, with MT cells, each MT cell made up of the high-threshold voltage transistors and low-threshold voltage transistors.

2. The automatic circuit generation method according to claim 1, wherein the replacement step of replacing each high-threshold cell with each MT cell uses a MT cell having a control terminal through which ON/OFF operation of each high-threshold voltage transistor in the MT cell is controlled in order to control the amount of a leak current in the MT cell.

3. The automatic circuit generation method according to claim 1, further comprises a step of outputting an improved net list in which the high-threshold cells and the MT cells are mixed.

4. The automatic circuit generation method according to claim 1, wherein the net list and the improved net list are a hierarchical net list that is constructed in a plurality of hierarchical levels of circuit modules, and
the method further comprises a step of generating ports and signals which are transferred among the plurality of the hierarchical modules in order to electrically connect the control terminal of each MT cell up to an uppermost module of the logical circuit through each hierarchical level in the net list.

5. The automatic circuit generation method according to claim 1, further comprises a step of generating a timing constraint for a setup time of the control signal to control an amount of a leak current flowing through each MT cell, and outputting the timing constraint generated.

6. The automatic circuit generation method according to claim 1, further comprises a stop of analyzing a change of the control signal, that controls the amount of the leak current in the MT cell, corresponding to a test vector supplied from outside, and a step of estimating the amount of the leak current flowing through the logical circuit of the net list.

7. The automatic circuit generation method according to claim 1, wherein a net list having high-threshold cells and MT cells mixed is inputted in addition to the net list having the high-threshold calls in the step of inputting the circuit information including the net list, and
further comprises a step of replacing the MT cells in a path having an adequately-larger timing margin than the timing constraint with the high-threshold cells without any causing the timing violation, in addition to the stop of replacing the high-threshold cells in the path having a delay time larger than the timing constraint with the MT cells.

8. The automatic circuit generation method comprising:
inputting circuit information, to be used for performing an automatic logical circuit generation, including a net list only having MT cells made up of high-threshold voltage transistors and low-threshold voltage transistors, and interpreting the circuit information inputted;
identifying a path having an adequately-larger timing margin than the timing constraint that has been set in advance by performing a static timing analysis for a logical circuit in the net list based on the result of the analysis for the circuit information inputted; and
replacing the MT cells in the path having the adequately-larger timing margin than the timing constraint with high-threshold cells each made up of high-threshold voltage transistors.

9. The automatic circuit generation method according to claim 8, further comprises a step of outputting an improved net list having both the high-threshold cells and the MT cells mixed.

10. An automatic circuit generation method comprising:

inputting circuit information, to be used for performing an automatic logical circuit generation, including a net list having high-threshold cells made up of only high threshold voltage transistors and MT cells made up of high threshold voltage transistors and low-threshold voltage transistors mixed, and interpreting the circuit information inputted;

identifying a path whose delay time in larger than a timing constraint that has been set in advance and a path having an adequately-larger timing margin than the timing constrain by performing a static timing analysis for a logical circuit of the net list based on the result of the analysis for the circuit information inputted; and replacing high-threshold cells in at least a part of the path whose delay time is larger than the timing constraint with MT cells, and replacing the MT cells in the path of the adequately-larger timing margin with the high-threshold cells without any causing the timing violation.

11. The automatic circuit generation method according to claim 10, further comprises a step of outputting an improved net list in which the high-threshold cells and the MT cells are mixed.

12. An automatic circuit generation method comprising;

inputting circuit information, to be used for performing an automatic logical circuit generation, including a net list having MT cells made up of high-threshold voltage transistors and low-threshold voltage transistors mixed, and interpreting the circuit information inputted;

identifying a path whose delay time is larger than a timing constraint that has been set in advance by performing a static timing analysis for a logical circuit in the net list based on the result of the interpretation for the circuit information inputted; and replacing the MT cells in the path of the adequately-larger timing margin than the timing constraint with the high-threshold cells without any causing the timing violation.

13. The automatic circuit generation method according to claim 12, further comprises a step of outputting an improved net list in which the high-threshold cells and the MT cells are mixed.

14. An automatic circuit generation apparatus comprising;

an input process section inputting and interpreting circuit information including a net list of cells forming a logical circuit;

a timing analysis section performing a static timing analysis for the logical circuit, and based on a result of the interpretation obtained by the input process section, identifying a path whose delay time is larger than a timing constraint that has been net in advance, or identifying a path having an adequately-larger timing margin than the timing constraint:

a cell replacement section replacing a part of or all of high-threshold cells in the path having the larger delay time than the timing constraint with MT cells in which high threshold voltage transistors and low-threshold voltage transistors are mixed, or replacing MT cells in the path having the adequately-larger timing margin;

an output section outputting an improved net lint in which the high-threshold cells and the MT cells are mixed based on the replacement result obtained by the cell replacement section.

15. A computer program product including instructions for executing, by a computer system, an automatic circuit generation method comprising:

inputting circuit information, to be used in an automatic logical circuit generation, including a net list of cells, and interpreting the circuit information inputted;

identifying a path whose delay time is larger than a timing constraint that has been set in advance, or a path having an adequately-larger timing margin than the timing constraint, by performing a static timing analysis for a logical circuit of the net list based on the result of the analysis for the circuit information inputted; and replacing high-threshold calls in at least a part of the path having the larger delay time than the timing constraint with MT cells made up of high-threshold voltage transistors and low-threshold voltage transistors, and replacing MT cells in at least a part of the path having the adequately larger timing margin with the high-threshold cells without any causing the timing violation.

* * * * *